(12) United States Patent
Razeghi

(10) Patent No.: US 6,420,728 B1
(45) Date of Patent: Jul. 16, 2002

(54) MULTI-SPECTRAL QUANTUM WELL INFRARED PHOTODETECTORS

(76) Inventor: Manijeh Razeghi, 1500 Sheridan Rd., Wilmette, IL (US) 60091

( * ) Notice: Subject to any disclaimer, the term of this patent is extended or adjusted under 35 U.S.C. 154(b) by 0 days.

(21) Appl. No.: 09/533,305

(22) Filed: Mar. 23, 2000

(51) Int. Cl.$^7$ ............................................... H01L 29/06
(52) U.S. Cl. ...................................... 257/14; 257/225
(58) Field of Search ........................... 250/211; 357/30; 257/21, 186, 197, 14, 184, 194; 259/194

(56) References Cited

U.S. PATENT DOCUMENTS

| | | | | |
|---|---|---|---|---|
| 4,822,992 A | * | 4/1989 | Bar-joseph et al. | 250/211 |
| 5,077,593 A | * | 12/1991 | Sato et al. | 357/30 |
| 5,198,682 A | * | 3/1993 | Wu et al. | 257/21 |
| 5,258,632 A | * | 11/1993 | Sawada | 257/194 |
| 5,296,720 A | * | 3/1994 | Wen et al. | 257/21 |
| 5,432,361 A | * | 7/1995 | Taguchi | 257/186 |
| 5,479,032 A | | 12/1995 | Forrest et al. | 257/190 |
| 5,510,627 A | * | 4/1996 | Snow | 257/21 |
| 5,543,629 A | * | 8/1996 | Nakamura et al. | 257/21 |
| 5,552,603 A | | 9/1996 | Stokes | 250/338 |
| 5,631,477 A | * | 5/1997 | Streit et al. | 257/197 |
| 5,646,421 A | | 7/1997 | Liu | 257/21 |
| 6,005,259 A | | 12/1999 | Su et al. | 257/15 |
| 6,130,466 A | | 10/2000 | Schneider et al. | 257/440 |
| 6,184,538 B1 | | 2/2001 | Bandara et al. | 257/21 |

FOREIGN PATENT DOCUMENTS

JP 405021839 A 1/1993

OTHER PUBLICATIONS

K.L. Tsai, et al., "Two–Dimensional Bi–Periodic Grating Coupled One– and Two–Color Quantum Well Infrared Photodetectors", IEEE Electron Device Letters, vol. 16, No. 2, Feb. 1995, pp. 49–51.

* cited by examiner

Primary Examiner—David Nelms
Assistant Examiner—Bau T Le
(74) Attorney, Agent, or Firm—Welsh & Katz, Ltd.

(57) ABSTRACT

A multispectral detector is grown epitaxially on a substrate such as InP, GaAs, or Si and comprises sets of multiquantum well layers. In the method of the subject invention, contact layers are grown on the substrate and on top of the active layers. The active layers comprise one or more sets of multiquantum well layers grown adjacent to each other. The active layers and multiquantum wells and consist of well and barrier layers prepared from various stochiometric ratios of InGaAlAs and InGaAsP, with the barrier layers of InAlAs and InP, or well layers GaInP interspersed with barrier layers of $Ga_xI_{1-x}As_yP_{1-y}$ ($0 \leq x \leq 1$, $0 \leq y \leq 1$).

23 Claims, 3 Drawing Sheets

MULTI-SPECTRAL QUANTUM WELL INFRARED PHOTODETECTORS

This invention is made with government support under Contract No. AFOSR-F-49620 97-1-0288. The government has certain rights in the invention.

FIELD OF THE INVENTION

This invention relates to semiconductor III-V alloy compounds, and more specifically to multispectral QWIPS.

BACKGROUND OF THE INVENTION

The importance of semiconductor detectors is rapidly increasing along with progress in other opto-electronic fields, such as optical fiber communication, charge-coupled devices, and solid state lasers.

Thermal detectors and thermal imaging detector arrays are based on the local detection of infrared radiation emitted by a scene, and in the case of an imaging detector array allows the representation of the scene's objects by the thermal gradients. This is because the infrared energy radiated by an object is proportional to its absolute temperature $T_0$ and its emissivity $\epsilon_0$. On the other hand, sources of stray infrared radiation (background, sky, Sun, other objects, etc.) having temperatures $T_1$, $T_2$, $T_3$, etc. and emissivities $\epsilon_1, \epsilon_2, \epsilon_3$, and so on, can add, after reflection, a disturbing radiative contribution to the intrinsic emission and reflectance of the object being imaged. The infrared detector or imager is sensitive to the sum of these reflected and emitted energies.

A multi-spectral infrared deflector is defined as a detector which is sensitive to more than one band of wavelengths of infrared radiation (usually infrared radiation is defined as wavelengths $\lambda$ in the range between $\lambda=1$ $\mu m$ and $\lambda=50$ $\mu m$). Each band of wavelengths has a cut-on and cut-off wavelength, but is most commonly defined by a peak wavelength $\lambda_p$ and a bandwidth $\Delta\lambda$.

In the most favorable measurement case there are no stray reflections and the object is assumed to have a constant emissivity within the spectral intervals $\Delta\lambda 1$ and $\Delta\lambda 2$ (gray body). Then the energy emitted by the object itself depends only on the two quantities $\epsilon_0$ and $T_0$. However, a measurement in a single spectral band gives only one relationship and it is not possible to solve one equation for the two unknown variables. In this case the emissivity must be estimated or calibrated externally to the measurement. On the other hand, a thermal measurement system operating in two wavelength bands allows the setting up of two relationships (for the two unknowns) which ten determine the temperature $T_0$ and emissivity $\epsilon_0$ of the object. Thus only a bispectral measurement can give fast and accurate remote access to the thermal characteristics of an unknown object when the latter radiates as a gray body. Multi-spectral imaging (more then two wavelength bands detected) can be used to eliminate the effects of stray reflections.

Bispectral or multi-spectral imaging can provide information about the relative effects of emissivity and temperature when $\epsilon_0$ is not constant, but is instead a function of wavelength. It is also possible to image or measure the temperature of two thermally different objects that would be indistinguishable ins single-band observation. In this case, if the two objects produce the same radiance in a spectral band $\Delta\lambda_2$. Thus, the thermal constant between the two objects in the band $\Delta\lambda_2$ can be used to increase the contrast of the overall image.

Practical applications of multi-spectral detectors include infrared "heat seeking" missiles which use infrared imaging arrays to locate and track the movement of the missile's target. Often these targets are equipped with infrared countermeasures. These can include small decoys, such as flares or chafe, or powered decoy vehicles that can be deployed by an aircraft or warship to lure away the heat seeking missile. Countermeasures can also include infrared lamps and lasers intended to overload (blind) or burn the missile's infrared detector. Decoys usually lure away the missile by providing a brighter (stronger) infrared signal at the wavelength to which the missile's detector is most sensitive. In either case, a bispectral or multi-spectral detector is less likely to fail when opposed by such countermeasures. It can continue to track the target even if one waveband has been blinded/burned by a laser. And since most decoys cannot match the temperature and emissivity signature of the target across several wavebands, the spectral "fingerprint" of the target can be used to ignore decoy countermeasures.

When analyzing infrared images taken by a multi-spectral detector, one image is first generated for each waveband. In order to combine the images to improve the contrast, or to compute the temperature and emissivity, the signal for each pixel in the images must have come from the same source. If more than one detector is used, each detector will view a slightly different scene (parallax). This makes the pixel-to-pixel registration of the images computationally difficult and time consuming. For this reason monolithically integrated detectors, wherein the detectors are stacked on top of each other, are desirable.

SUMMARY OF THE INVENTION

An object, therefore, of the invention is a QWIP (Quantum Well Infrared Photodetector) consisting of a multiple quantum well structure grown on laP substrate for use as a sensor having multi-spectral detection.

A further object of the subject invention is a two-color QWIP structure for detection of two wavelengths in the range $3<\lambda<5$ microns.

A further object of the subject invention is a two-color QWIP structure for detection of two wavelengths, one in the range $3<\lambda<5$ and one in the range $8<\lambda<12$ microns.

A further object of the subject invention is a multi-spectral QWIP structure for simultaneous three-color detection of wavelengths in the ranges $3<\lambda_1<5$ microns, $8<\lambda_2<12$ microns.

DETAILED DESCRIPTION OF THE INVENTION

Figure 1:
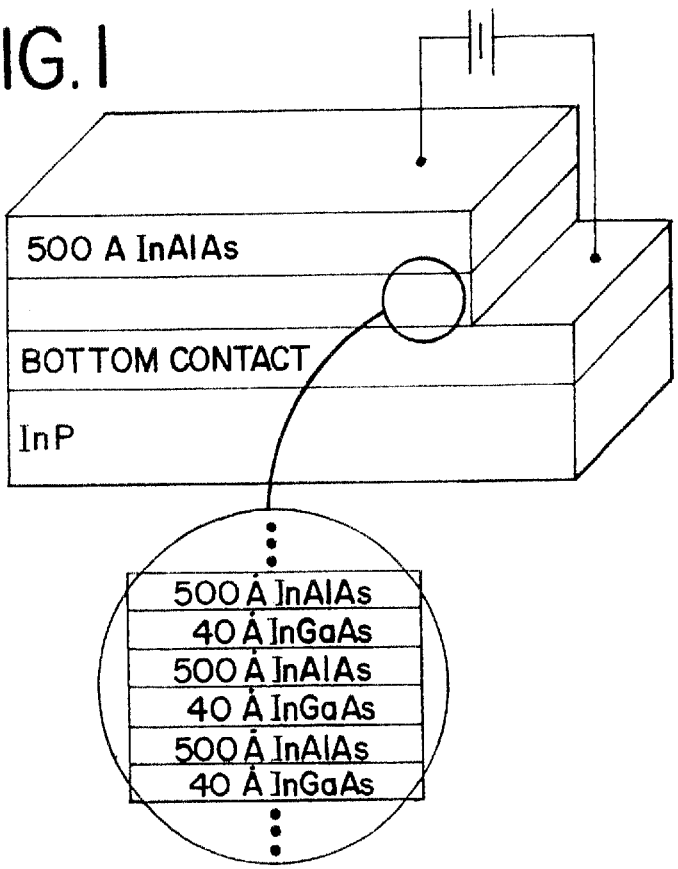
FIG. 1 is a cross-section showing a device capable of detecting short wavelengths.

The reactor and associated gas-distribution scheme used herein are substantially as described in U.S. Pat. No. 5,384,151. The system comprises a cooled quartz reaction tube pumped by a high-capacity roughing pump (120 hr$^{-1}$) to a vacuum between 7 and 760 Torr. The substrate was mounted on a pyrolytically coated graphite susceptor that was heated by rf induction. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼ -inch stainless steel tubes. Flow rates were controlled by mass flow control.

The reactor was purged with a hydrogen flow of 4 liters min$^{-1}$, and the working pressure of 10–100 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure.

The gas sources used in this study for the growth of GaN and GaInN by LP-MOCVD are listed below.

| Group-III Sources | Group-V Source |
|---|---|
| Al $(CH_3)_3$ | t-butylamine |
| Al $(C_2H_5)_3$ | $NH_3$ |
| $In(CH_3)_3$ | $PH_3$ |
| $In(C_2H_5)_3$ | $P(CH_3)_3$ |
| $(CH_3)_2In(C_2H_5)$ | $P(C_2H_5)_3$ |
| $Ga(CH_3)_3$ | $As(CH_3)_3$ |
| $Ga(C_2H_5)_3$ | $As(C_2H_5)_3$ |

An accurately metered flow of purified $H_2$ or $N_2$ for TMI is passed through the appropriate bubbler. To ensure that the source material remains in vapor form, the saturated vapor that emerges from the bottle is immediately diluted by a flow of hydrogen or $N_2$. The mole fraction, and thus the partial pressure, of the source species is lower in the mixture and is prevented from condensing in the stainless steel pipe work.

Pure and diluted ammonia ($NH_3$) is used as a source of N. The metal alkyl or hydride flow can be either injected into the reactor or into the waste line by using two-way valves. In each case, the source flow is first switched into the waste line to establish the flow rate and then switched into the reactor. The total gas flow rate is about 8 liters min$^{-1}$ during growth. Stable flows are achieved by the use of mass flow controllers.

Dopants usable in the method of the subject invention are as follows:

| n dopant | p dopant |
|---|---|
| $H_2Se$ | $(CH_3)_2Zn$ |
| $H_2S$ | $(C_2H_5)_2\ Zn$ |
| $(CH_3)_3Sn$ | $(C_2H_5)_2\ Be$ |
| $(C_2H_5)_3Sn$ | $(CH_3)_2Cd$ |
| $SiH_4$ | $(\eta C_2H_5)_2Mg$ |
| $Si_2H_6$ | $Cp_2Mg$ |
| $GeH_4$ | |

The substrate can be GaAs, Si, $Al_2O_3$, MgO, SiC, ZnO, $LiGaO_2$, $LiAlO_2$, $MgAl_2O_4$ or GaN. Preferably, sapphire ($Al_2O_3$) is used as the substrate. The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 700° and 1000° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

For best results, all surfaces of the growth reaction chamber are coated with a barrier coating capable of withstanding high temperatures and not reacting with the reactants and dopants utilized therein at such high temperatures. Preferably, a coating of AlN or of SiC is grown in situ in the reaction chamber to cover all surfaces therein. There is thus formed a stable layer that prevents oxygen and other impurities originating within the reaction chamber from reacting with the semiconducting layer to be grown.

High quality III-IV layers may be grown in the method of the subject invention by low pressure metalorganic chemical vapor deposition (LP-MOCVD). The layers of the heterostructure are grown by an induction-heated horizontal cool wall reactor. The sources set forth above are typically used as the sources for the element desired. Pure and diluted ammonia gas ($NH_3$) is generally used as the N source and $PH_3$ for the P source Sample is typically grown on a sapphire substrate. A buffer layer of GaN or InP and thin contact layers of InAlAs may be individually laid at thicknesses from 500 Å to a few μm. The optimum growth conditions for the respective layers are listed in Table 1. The confinement of the active layer for the subject invention may be as a heterostructure, separate confinement heterostructures or with a quantum well.

Other forms of deposition of III-V films such as the subject invention, may be used as well including MBE (molecular beam epitaxy), MOMBE (metalorganic molecular beam epitaxy), LPE (liquid phase epitaxy and VPE (vapor phase epitaxy).

Doping is preferably conducted with bis-cyclopentadienyl magnesium ($CP_2Mg$) for p-type doping and silane ($SiH_4$) for n-type doping. Doping is performed through a $BCP_2Mg$ bubbler with $H_2$ as carrier gas and at temperatures from −15° C. to ambient temperatures at 20–1500 cm$^3$ min.$^{-1}$ and onto either a hot or cooled substrate. Dilute SiH4 may be simply directed at ambient temperatures onto the hot substrate at 20–90 cm$^3$ min.$^1$.

In a preferred doping method for incorporating the maximum amount of p-type dopant on the layer, once the p-type layer to be doped is fully grown, the heat source is terminated and the substrate allowed to cool; the metal and hydride sources are terminated; the dopant flow, for instance DEMg, is initiated at the temperatures indicated for diffusion onto the cooled substrate/epilayer which has been previously grown. After about 2–3 minutes, the dopant flow is terminated and the next epilayer grown. By this method, it is found that $10^{20}$ atoms/cm$^3$ of Mg may be placed on the top surface of the epilayer.

TABLE 1

Optimum growth conditions.

|  | InP | GaInN | InGaAlAs | GaN | InAlAs | InGaAs |
|---|---|---|---|---|---|---|
| Growth Pressure mmHg | 76 | 76 | 76 | 76 | 76 | 76 |
| Growth Temperature (° C.) | 500 | ~800 | ~800 | ~1000 | ~800 | ~800 |
| Total H$_2$ Flow Rates θ/min. | 3 | 3 | 3 | 3 | 3 | 3 |
| TMI (cc/min) | 100 | 200 | 100 | — | 100 | 100 |
| TEG (cc/min) | — | 120 | 20 | 120 | — | 20 |
| NH$_3$ (cc/min) | — | ~3000 | — | ~3000 | — | — |
| Al(CH$_3$)$_3$ (cc/min) | — | — | 20 | — | 20 | — |
| As(CH$_3$)$_3$ (l/min.) | — | — | 12 | — | 12 | — |
| Growth Rate (Å/min) | 200 | 30 | 220 | 250 | 200 | 200 |

EXAMPLE

The epitaxial layers are grown on (0001) sapphire substrates using a horizontal flow low pressure metalorganic chemical vapor deposition (LP-MOCVD) reactor. The inductively heated SiC-coated graphite susceptor is rotated at a speed of ~50–100 rpm to achieve better uniformity of films. Trimethyl-gallium (TMGa) and triethyl-gallium (TEGa) are used as the gallium (Ga) source materials, trimethyl-indium (TMIn) is used as the indium (In) source tremethyl arsenic (TMA) and trimethyl aluminum is used as the aluminum (Al). The carrier gases include Palladium diffused hydrogen and resin purified nitrogen. Another manner of achieving the growth of the III-IV layers of the subject invention may be by a gas-source molecular beam epitaxy (MBE) system. Such a system differs from typical MBE design in the mechanism by which it provides the flux of group V atoms (As and P) to the substrate surface.

Elemental phosphorus consists of allotropic forms, each of which has a different vapor pressure. For this reason, it is difficult to achieve a stable flux using temperature control. The solution is to replace the solid phosphorus source with a hydride gas. In this situation, a phosphorus beam flux is created by the thermal decomposition of phosphine, (PH$_3$) a hydride gas, within a gas cracker. The gas cracker is supplied with gas by a controllable leak valve or mass flow controller.

Epi-ready substrates which did not require any cleaning procedures were used for epitaxy. For some wafers, the epi-ready substrates were attached to a molybdenum (Mo) block using pure indium metal. The indium is heated to its melting point (~150° C.) and the GaAs substrate is affixed by sliding it repeatedly across the melted indium until it has completely wetted. The Mo block is then cooled. For larger 2 and 3 inch GaAs wafers, indium-free molybdenum rings were used. The GaAs is attached to the Mo ring using two circular clamps held to the Mo ring with molybdenum wire.

After the substrate is mounted, it is loaded into the MBE entry/exit chamber. When this chamber has achieved a pressure of $10^{-7}$ torr, the wafer is heated to 300° C. to remove any water vapor condensed on it. The wafer is then transferred to a buffer chamber, where several samples can be stored. Each wafer is transferred into the growth chamber immediately before growth.

The RHEED instrument makes use of the wavelike nature of electrons. For electrons with energies of 5–50 keV, the wavelength is of the order of 0.1 Å. When a narrow beam of such electrons impinges on the semiconductor surface at a glancing angle it is diffracted by the crystal lattice within a few angstroms of the surface. During the growth of one monolayer of semiconductor, the surface roughens (corresponding to a half-completed layer) and then smoothes again (corresponding to the completion of that layer). This layer-by-layer growth can be detected in the oscillations of the diffracted RHEED beam, and a record of the oscillations can be used to determine the growth rate.

Typical MBE growth is carried out at a temperature greater than the co-sublimation temperature of GaAs (i.e. at a temperature where arsenic (As) sublimates from the surface faster than gallium (Ga)). For this reason, MBE growth of thin films on GaAs substrates must occur under arsenic overpressure conditions in order to prevent the wafer surface from roughening due to pooling of excess gallium atoms into droplets. Under As-rich conditions, the growth rate will be determined by the arrival rate of gallium atoms. Thus, a RHEED measurement is of a GaAs growth rate is actually a measurement of the arrival rate of gallium atoms. A similar procedure can be completed for the indium and phosphorus incorporation rates by measuring the RHEED oscillations of InP thin films.

Semiconductor structures often require precise tailoring of the carrier concentration. This is accomplished in an MBE procedure by sublimating controlled amounts of dopant atoms to create the required n or p type material. In the GSMBE system described herein, silicon is used as the n dopant, and beryllium is used as the p dopant. The dopant concentration is measured using electrochemical capacitance voltage profiling. By growing a multi-layer structure consisting of several thin films each with a different dopant concentration, the dependence of the dopant concentration on the dopant cell temperature can be determined.

The optimized growth conditions for certain III-IV materials are shown above. These conditions have been optimized by using electrical, optical, and structural characterization techniques such as x-ray diffraction, photoluminescence, and capacitance-voltage measurements.

The subject invention may be epitaxially grown on semi-insulating InP (100) substrates. The epitaxial structure has the following layers: a 1 µm n+InP (doped with a p-type dopant such as silicon to a level of $1\times10^{18}$ cm$^{-3}$) layer for bottom ohmic contacts, between one and three sets of heterostructure multiple quantum wells: each having 21 cycles of an undoped barrier layer and 20 cycles of an n-doped well layer (doped with silicon to a level of $8\times10^{17}$ cm$^{-3}$ with 2.5 Å undoped at both heterointerfaces), and a 0.5 µm n+InP (doped with silicon to a level of $1\times10^{18}$ cm$^{-3}$) layer for a top ohmic contact layer.

Figure 2:
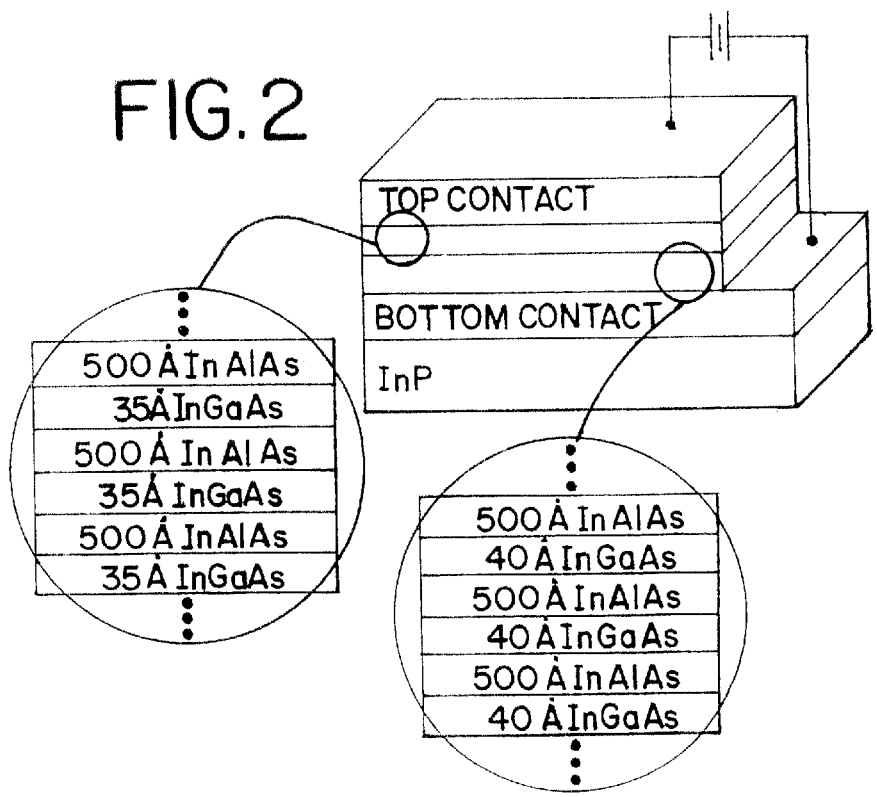
FIG. 2 is a cross-section of a semiconductor structure for a two color QWIP.
Figure 3:
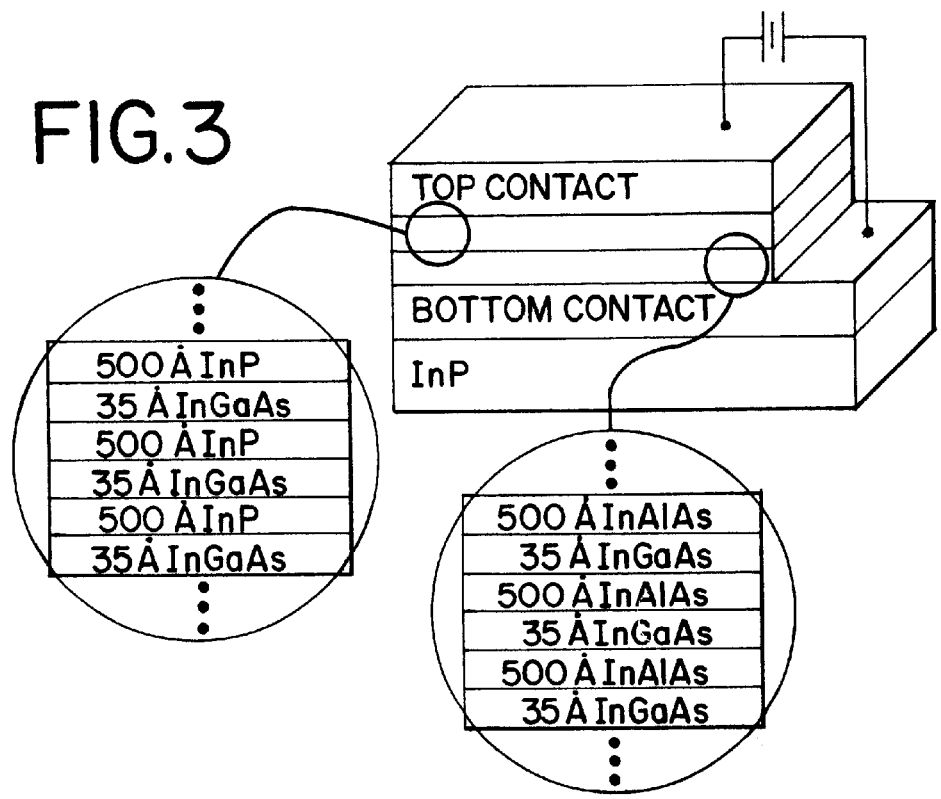
FIG. 3 is a cross-section of a semiconductor structure for two color MWIR-LWIR detector.
Figure 5:
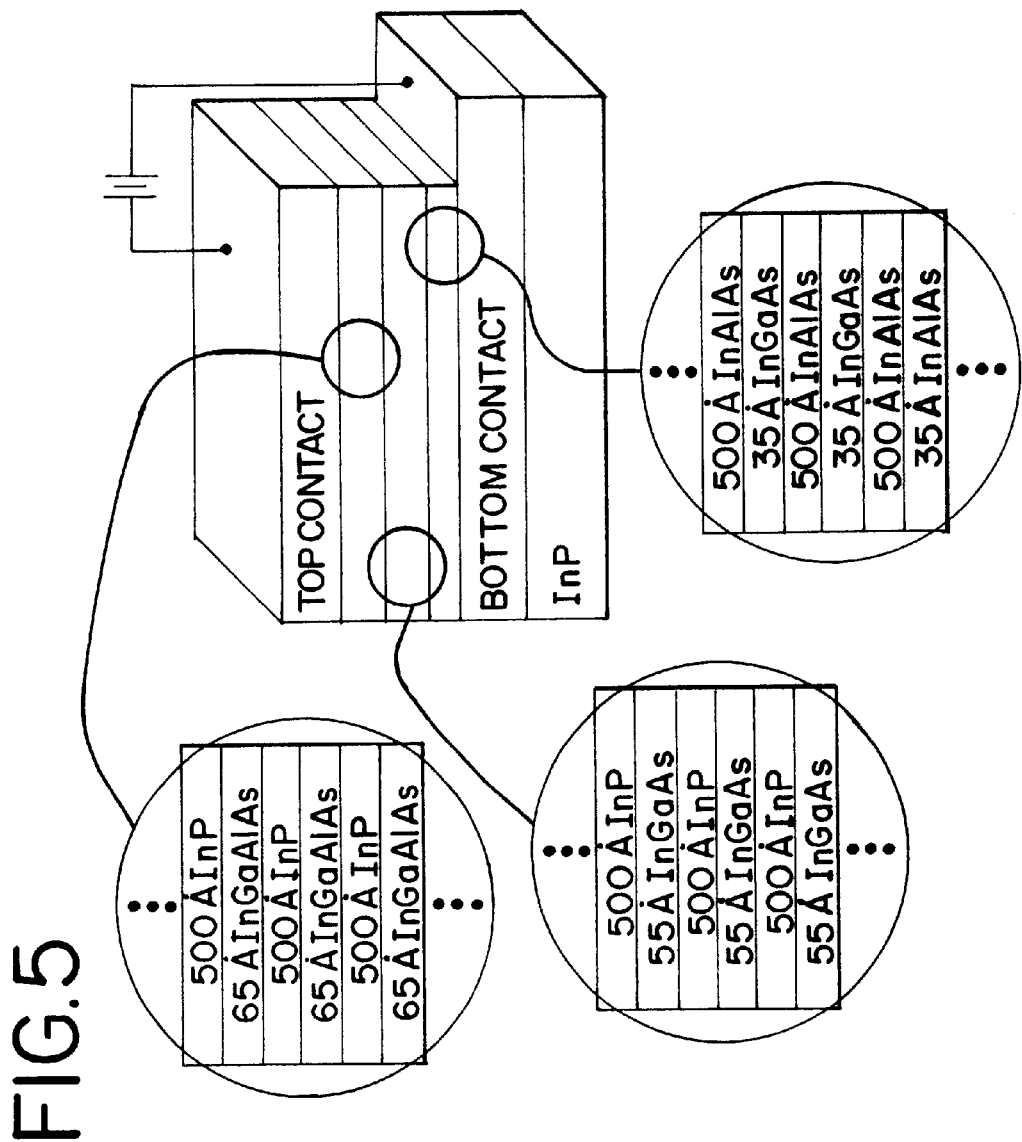
FIG. 5 is a cross-section of QWIP capable of detecting 3 wavelengths.

Depending on the regions of the electromagnetic spectrum that must be detected by the subject invention multi-spectral detector, combinations of the following sets are grown, as described in accordance with the drawings, and in particular with FIG. 2, FIG. 3, and FIG. 5.

Set 1: Detector for Wavelengths in the region 3<λ<5 microns

|  | Well | Barrier |
|---|---|---|
| Material | $In_{0.53}Ga_{0.47}As$ | $In_{0.52}Al_{0.48}As$ |
| Thickness | 35 Å | 300 Å |

Set 2: Detector for Wavelengths in the region 8<λ<12 microns

|  | Well | Barrier |
|---|---|---|
| Material | $In_{0.53}Ga_{0.47}As$ | InP |
| Thickness | 55 Å | 500 Å |

Set 3: Detector for Wavelengths in the region 12<λ microns

|  | Well | Barrier |
|---|---|---|
| Material | $In_{0.52}Ga_{0.48}Al_xAs$ | InP |
| Thickness | ~65 Å | 500 Å |

FIG. 1 shows a device with the ability to detect shorter wavelengths than previous QWIP-based devices. The design of FIG. 1 is based on thin film layers lattice matched to InP. and has thin film layers of $In_{0.53}Ga_{0.47}As$ and $In_{0.52}Al_{0.48}As$. With this structure, a shorter absorption wavelength of Å is obtained than previously possible.

FIG. 2 shows a two-color QWIP with both Δλ in the mid-wavelength infrared (MWIR) region. The device design of FIG. 2 is based on thin film layers lattice matched to InP and having two superlattices with thin film layers of $In_{0.53}Ga_{0.47}As$ and $In_{0.52}Al_{0.48}As$. With this structure, multiple absorption wavelengths are observed in the spectral band between λ=3 μm and λ=5 μm, using QWIP detectors.

FIG. 3 shows a two-color MWIR-LWIR detectors grown on InP substrate, with device design based on thin film layers lattice matched to InP. This device obtains simultaneous absorption wavelengths in both the spectral bands 3<λ<5 and 8<λ<12 using thin film layers of $In_{0.53}Ga_{0.47}As$/InP and $In_{0.53}Ga_{0.47}As$/$In_{0.52}Al_{0.48}As$.

Figure 4:
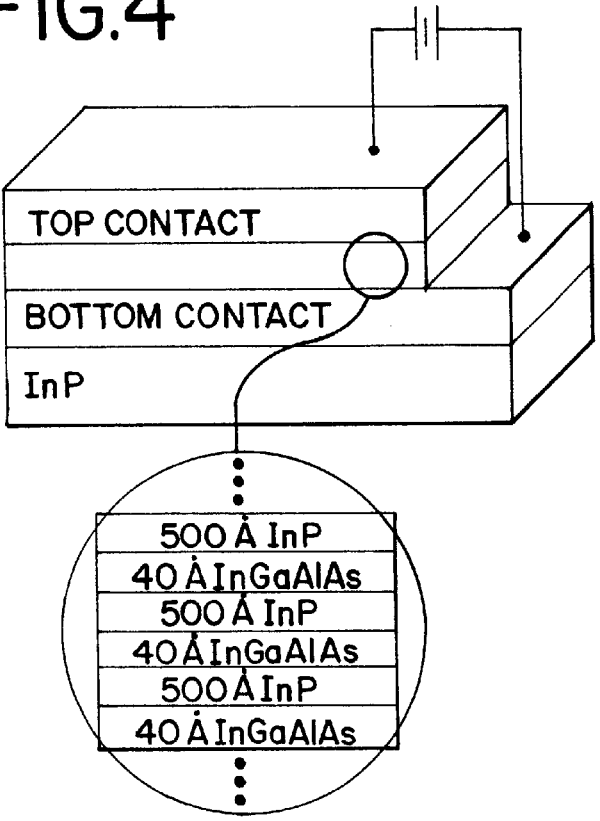
FIG. 4 is a cross-section of a QWIP device based on GaInAlAs.

FIG. 4 is a cross-section of a QWIP made from GaInAlAs, or more particularly, $Ga_xIn_yAl_{1-x-y}As$ thin film quantum well layers lattice matched to InP.

FIG. 5 depicts a three-color QWIP, with three active layers, based on thin film layers lattice matched to InP; the thin film layers are $In_{0.52}Ga_{0.38}Al_{0.1}As$/Inp. The top superstructure alternates InP with InGaAlAs, the middle superstructure alternates InP with InGaAs, and the bottom superstructure alternates InAlAs with InGaAs. This structure obtains simultaneous absorption wavelengths in all three spectral bands 3<λ<5, 8<λ<12, and 12>λ. Other well and barrier combinations comprise $GaInP/Ga_xIn_{1-x}As_yP_{1-y}$ ($0 \leq x \leq 1$, $0 \leq y \leq 1$).

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents.

What is claimed is:

1. A multispectral quantum wall infrared photodetector device comprising a substrate, upper and lower contact layer, and one to three sets of heterostructure multiple quantum wells, aligned one on top of each other, selected from the group consisting of the respective barrier layers and well layers of
   (a) InGaAs and InAlAs
   (b) InGaAs and InP; and
   (c) InGaAlAs and InP
absorbing in the range selected from the group consisting of 3 to 5 microns, 8 to 12 microns and above 12 microns.

2. The device of claim 1, wherein the substrate is InP, GaAs, and Si.

3. The device of claim 1, wherein the upper and lower contact layer is InP doped with a n-type dopant selected from the group consisting of Se, S, Si, Sn, and Ge.

4. The device of claim 1, wherein InGaAs is $In_{0.53}Ga_{0.47}As$.

5. The device of claim 1, wherein InAlAs is $In_{0.52}Al_{0.48}As$.

6. The device of claim 1, wherein InGaAlAs is InGaAlAs is $In_{0.53}Ga_{0.48}Al_xAs$.

7. The device of claim 1, wherein there are 21 well cycles of InGaAs or GaInP and 20 barrier cycles of InAlAs or $Ga_xIn_{1-x}Ay_yP_{1-y}$, each well cycle being adjacent a barrier cycle.

8. The device of claim 7, wherein each InGaAs layer is 35 Å and each InAlAs layer is 300 Å.

9. The device of claim 1, wherein there are 21 cycles of InGaAs and 20 cycles of InP, each cycle of InGaAlAs being adjacent of a cycle of InP.

10. The device of claim 9, wherein each layer of InGaAs is 55 Å and each layer of InP is 500 Å.

11. The device of claim 1, wherein there are 21 cycles of InGaAlAs and 20 cycles of InP, each cycle of InGaAlAs being adjacent of a cycle of InP.

12. The device of claim 11, wherein each cycle of InGaAlAs is 65 Å and each cycle of InP is 500 Å.

13. The device of claim 11, wherein each layer of InGaAlAs is 65 Å and each layer of InP is 500 Å.

14. The device of claim 1, wherein the barrier layers are undoped.

15. The device of claim 1, wherein the well layers are doped with a n-type dopant selected from the group consisting of Se, S, Sn, Si, and Ge.

16. A multispectral quantum wall infrared photodetector device comprising a substrate of InP, upper and lower contact layer of InP, said upper contact layer being doped with a n-type dopant, said lower contact layer being doped with a p-type dopant, and one or three sets of heterostructure multiple quantum wells, aligned one on top of each other, selected from the group consisting of the respective barrier layer and well layers of
   (a) InGaAs and InAlAs
   (b) InGaAs and InP;
   (c) InGaAlAs and InP, and
   (d) GaInP and $Ga_xIn_{1-x}As_yP_{1-y}$ ($0 \leq x \leq 1$, $0 \leq y \leq 1$)
absorbing in the range selected from the group consisting of 3 to 5 microns, 8 to 12 microns and above 12 microns, said well layer being doped with a n-type dopant, each of said sets comprising 21 barrier layers and 20 well layers, each of said barrier layers being adjacent to one of said well layers.

17. The device of claim 16, wherein InGaAs is $In_{0.53}Ga_{0.47}As$.

18. The device of claim 16, wherein InAlAs is $In_{0.52}Al_{0.48}As$.

19. The device of claim 16, wherein InGaAlAs is $In_{0.53}Ga_{0.48}Al_xAs$.

20. The device of claim 16, wherein each InGaAs layer is 35 Å and each InAlAs layer is 300 Å.

21. The device of claim 16, wherein each layer of InGaAs is 55 Å and each layer of InP is 500 Å.

22. The device of claim 15, wherein the barrier layers are undoped.

23. The device of claim 15, wherein the well layers are doped with a n-type dopant, selected from the group consisting of Se, S, Sn, Si and Ge.

* * * * *